US006972616B2

(12) United States Patent
Wu

(10) Patent No.: US 6,972,616 B2
(45) Date of Patent: Dec. 6, 2005

(54) LOW-NOISE, FAST-SETTLING BIAS CIRCUIT AND METHOD

(75) Inventor: Stephen Wu, Fountain Valley, CA (US)

(73) Assignee: Broadcom Corporation, Irvine, CA (US)

( * ) Notice: Subject to any disclaimer, the term of this patent is extended or adjusted under 35 U.S.C. 154(b) by 21 days.

(21) Appl. No.: 10/823,711

(22) Filed: Apr. 14, 2004

(65) Prior Publication Data

US 2005/0231274 A1    Oct. 20, 2005

(51) Int. Cl.[7] .................................................. H03B 1/00

(52) U.S. Cl. ...................................... 327/558; 327/551

(58) Field of Search ................................. 327/551, 552, 327/553, 554, 556, 557, 558, 559

(56) References Cited

U.S. PATENT DOCUMENTS

| 4,437,067 | A | * | 3/1984 | McKenzie et al. | .......... 327/552 |
| 4,739,189 | A | * | 4/1988 | Kellogg | ....................... 327/555 |
| 5,463,346 | A | * | 10/1995 | Brooks | ........................ 327/553 |

* cited by examiner

Primary Examiner—Jeffrey Zweizig
(74) Attorney, Agent, or Firm—Squire, Sanders & Dempsey L.L.P.

(57) ABSTRACT

A low-noise, fast-settling bias circuit includes a first and a second low pass filter, such as RC filters. The second filter initially shorts out a resistor of the first filter with a switch (set to low impedance) in parallel. Accordingly, a capacitor of the first filter quickly charges up to the same voltage as the input bias voltage. As the second filter charges up, the switch slowly shuts off (high impedance). By this time, since the capacitor of the first filter has charged to the same voltage as the bias voltage, a large RC formed by the resistor of the first filter and the capacitor of the first filter is available to provide filtering for the desired bias current.

10 Claims, 2 Drawing Sheets

LOW-NOISE, FAST-SETTLING BIAS CIRCUIT AND METHOD

BACKGROUND

1. Technical Field

This invention relates generally to bias circuits, and more particularly, but not exclusively, to low-noise bias circuits that have a fast settling time.

2. Description of the Related Art

Bias circuits generates a steady constant bias currents or bias voltages that presets the operating threshold or operating point of a circuit or device, such as a transistor, diode, or magnetic amplifier. Bias circuits can also be used for circuits such as voltage-controlled oscillators (VCOs) and charge pumps. However, the noise performance of these circuits can be limited by noise contributed by the bias circuits.

In order to reduce noise in the bias circuit that might negatively effect other circuits, low pass filters (LPFs), such as resistor-capacitor (RC) filters are introduced into the bias circuit. For example, as shown in FIG. 1, a conventional bias circuit 100 includes a resistor 110 and a capacitor 120 that in combination form an RC filter that attenuates a signal above a cutoff frequency, thereby reducing noise in the signal.

However, a disadvantage of the LPFs is that the settling time of the LPFs is proportional to the product of their resistance and capacitance. Accordingly, the stronger the LPF, the longer it will take for the LPF to settle, which translates into a longer time until the bias current or voltage can be used.

Accordingly, a new bias circuit and method are needed that enable a quicker settling time.

SUMMARY

Embodiments of the invention provide a new bias circuit and method that provide a quick settling time in contrast to conventional LPFs.

In one embodiment, a circuit comprises a first filter, a second filter, and a switch. The first filter has a capacitor and a resistor as does the second filter. The second filter separated from the first filter by the switch. The second filter is capable of shorting the first filter resistor when the switch is set to low impedance, which causes the first filter capacitor to charge quicker than the capacitor of the second filter, even if the first and second filters have similar RC values (which is proportional to settling time). The switch is gradually changed to high impedance as the second filter capacitor charges.

In one embodiment, the method comprises: using a second filter, in conjunction with a switch set to low impedance, to short a resistor of a first filter, the short causing a capacitor of the first filter to charge quicker than a capacitor of the second filter; gradually switching the switch to high impedance as the second filter capacitor charges; and filtering using the first filter once the first filter capacitor is charged.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION OF THE ILLUSTRATED EMBODIMENTS

The following description is provided to enable any person having ordinary skill in the art to make and use the invention, and is provided in the context of a particular application and its requirements. Various modifications to the embodiments will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles, features and teachings disclosed herein.

Figure 1:
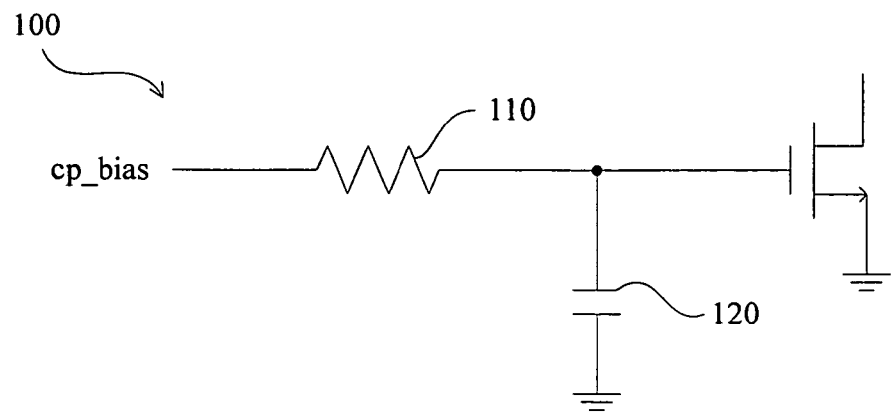
FIG. 1 is a block diagram illustrating a conventional bias circuit.
Figure 2:
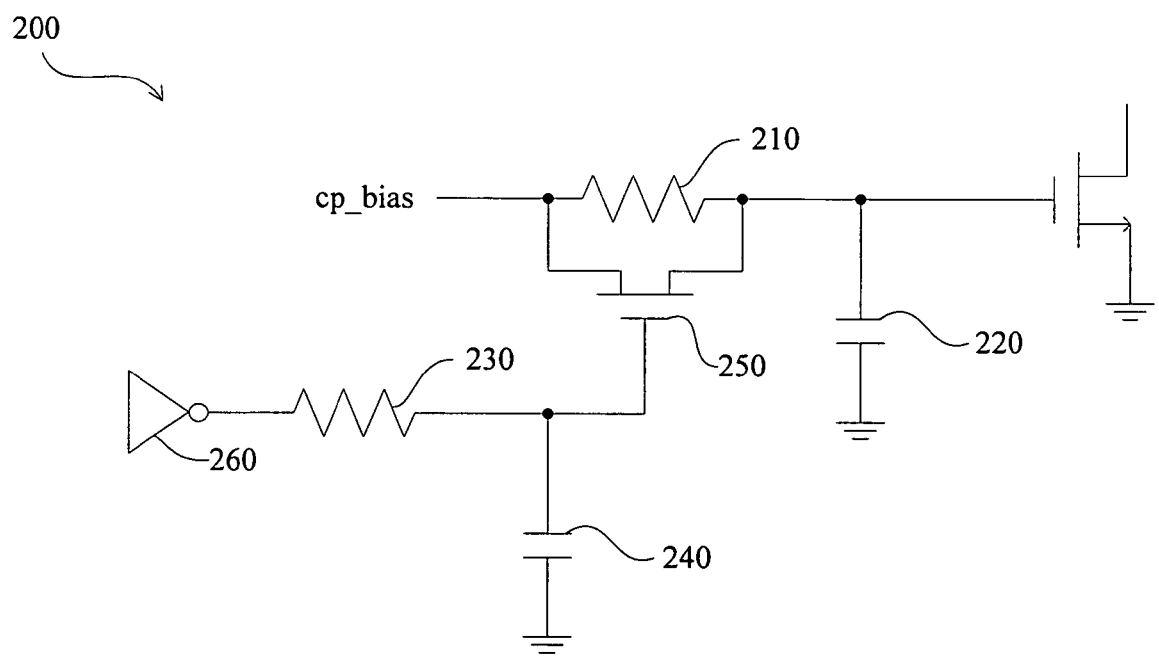
FIG. 2 is a block diagram illustrating a bias circuit according to an embodiment of the invention.

FIG. 2 is a block diagram illustrating a bias circuit 200 according to an embodiment of the invention. The bias circuit 200 includes a first LPF comprising a resistor 210 and a capacitor 220 and a second LPF comprising a resistor 230 and a capacitor 240. The second LPF is separated from the first LPF via a switch 250. Also communicatively coupled to the resistor 230 is an inverter 260, which acts as a buffer. In an embodiment of the invention, the capacitors 220 and 240 are grounded.

In an embodiment of the invention, the resistor 210 has a resistance of 1 MegaOhm; the capacitor 220 has a capacitance of 10 pF; the resistor 230 has a resistance of 1 MegaOhm and the capacitor 240 has a capacitance of 10 pF. Accordingly, both LPFs will have a corner frequency of 16 KHz.

During operation of the bias circuit 200, the second filter initially shorts out the resistor 210 with the switch 250 (set to low impedance) in parallel. Accordingly, the capacitor 220 quickly charges up to the same voltage as cp_bias. As the second filter charges up (with settling time determined by the resistor 230 and capacitor 240), the switch 250 slowly shuts off (high impedance). By this time, since the capacitor 220 has charged to the same voltage as cp_bias, a large RC formed by the resistor 210 and the capacitor 220 is available to provide filtering for the desired bias current.

Accordingly, the circuit 200 provides a much faster settling time at which the desired current is available than if one had to wait for the time constant of the resistor 210 and the capacitor 220 to settle. The purpose of slowly turning off the switch 250 is to minimize the charge injection on the capacitor 220 that would occur if the switch 250 was shut off rapidly. Any erroneous charge injected into the capacitor 220 would cause the voltage on the capacitor 220 to diverge from the desired value of V(cp_bias), and a long settling time determined by the resistor 210 and the capacitor 220 would have to be endured before the desired current would again be available (or equivalently, before the voltage on the capacitor 220 would settle back to V(cp_bias)).

In an embodiment of the invention, the bias circuit 200 can comprise other types of filters, such as high pass filters or bandstop filters. Further, the bias circuit 200 can comprise inductors in place of the resistors 210 and 230. In another embodiment of the invention, the resistors 210 and 230 and the capacitors 220 and 240 can be variable (e.g., programmable). For example, a capacitor array can be used in place of the capacitor 240 to enable a wide range of capacitance and therefore a wide range of attenuation and settling times. If the second LPF includes a variable resistor or capacitor, then the switch 250 can also be programmed to activate according to the variable settling time of the second LPF. In another embodiment of the invention, the first and/or second LPFs can be second or third order filters.

Figure 3:
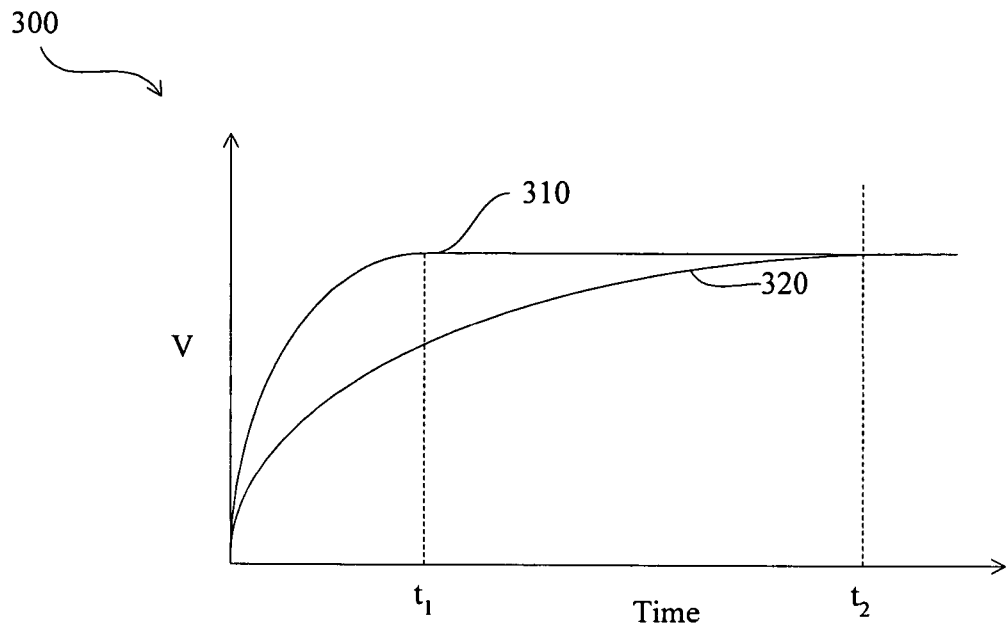
FIG. 3 is a chart illustrating voltage versus time for a conventional LPF versus the LPF of the bias circuit of FIG. 2.

FIG. 3 is a chart 300 illustrating voltage versus time for each of the LPFs of the bias circuit 200 (FIG. 2). Curve 310 represents voltage versus time for the first LPF while the curve 320 represents the voltage versus time for the conventional LPF 100. The curve 310 shows that the first LPF has a quicker settling time, $t_1$. In contrast, the curve 320 has a much slower settling time, $t_2$.

Figure 4:
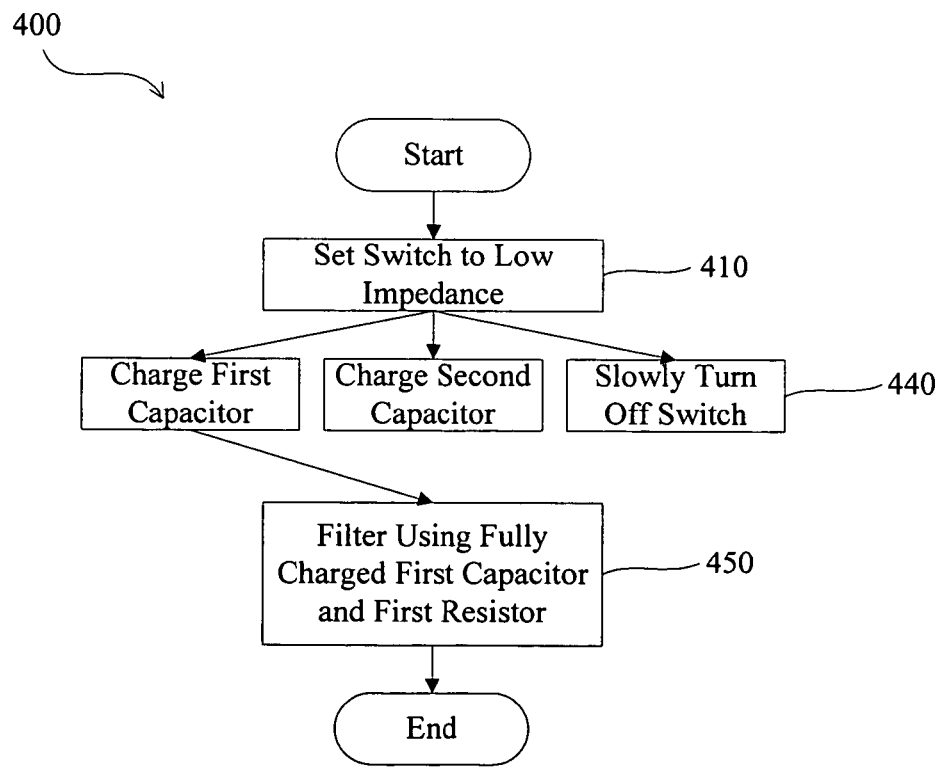
FIG. 4 is a flowchart illustrating a method of improving settling time.

FIG. 4 is a flowchart illustrating a method 400 of improving settling time of a filter. First, the switch 250 is set (410) to low impedance to initially short out, in conjunction with the second LPF, the resistor 210. The capacitor 220 is then quickly charged (420) up to the same voltage as cp_bias input to the circuit 200. Substantially simultaneously, the second capacitor 240 is charged (430) (at a rate slower than the capacitor 220) and the switch 250 is slowly switched (440) off (to high impedance) at a rate approximately equal to the rate the capacitor 240 is charged. Once the first capacitor 220 is charged, filtering (450) can begin using the first LPF.

The foregoing description of the illustrated embodiments of the present invention is by way of example only, and other variations and modifications of the above-described embodiments and methods are possible in light of the foregoing teaching. Components of this invention may be implemented using a programmed general purpose digital computer, using application specific integrated circuits, or using a network of interconnected conventional components and circuits. Connections may be wired, wireless, modem, etc. The embodiments described herein are not intended to be exhaustive or limiting. The present invention is limited only by the following claims.

What is claimed is:

1. A method, comprising:
   using a second filter, in conjunction with a switch set to low impedance, to short a resistor of a first filter, the short causing a capacitor of the first filter to charge quicker than a capacitor of the second filter;
   gradually switching the switch to high impedance as the second filter capacitor charges; and
   filtering using the first filter once the first filter capacitor is charged.

2. The method of claim 1, wherein the filters include low pass filters.

3. The method of claim 1, wherein the first filter and second filter have different RC values.

4. The method of claim 1, wherein the second filter is programmable to change the rate at which the switch changes from low impedance to high impedance.

5. The method of claim 1, wherein the first or second filter capacitor is programmable.

6. A circuit, comprising:
   a first filter having a capacitor and a resistor; and
   a second filter having a capacitor and resistor, the second filter separated from the first filter by a switch;
   wherein the second filter is capable of shorting the first filter resistor when the switch is set to low impedance, the short causing the first filter capacitor to charge quicker than a capacitor of the second filter;
   wherein the switch is capable of gradually changed to high impedance as the second filter capacitor charges.

7. The circuit of claim 6, wherein the filters include low pass filters.

8. The circuit of claim 6, wherein the first filter and second filter have different RC values.

9. The circuit of claim 6, wherein the second filter is programmable to change the rate at which the switch changes from low impedance to high impedance.

10. The circuit of claim 9, wherein the first or second filter capacitor is programmable.

* * * * *